United States Patent
Shim et al.

(10) Patent No.: US 8,203,170 B2
(45) Date of Patent: Jun. 19, 2012

(54) NITRIDE SEMICONDUCTOR LIGHT EMITTING DIODE

(75) Inventors: Hyun Wook Shim, Suwon (KR); Joong Seo Kang, Yongin (KR); Dong Min Jeon, Suwon (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 54 days.

(21) Appl. No.: 11/905,434

(22) Filed: Oct. 1, 2007

(65) Prior Publication Data
US 2008/0099782 A1    May 1, 2008

(30) Foreign Application Priority Data

Oct. 30, 2006    (KR) .................. 10-2006-0105772

(51) Int. Cl.
*H01L 33/00* (2010.01)
(52) U.S. Cl. .................. 257/103; 257/E33.064
(58) Field of Classification Search .............. 257/99, 257/101, 103, E33.033, E33.034, E33.064
See application file for complete search history.

(56) References Cited

U.S. PATENT DOCUMENTS

| | | | | |
|---|---|---|---|---|
| 2002/0008243 A1* | 1/2002 | Goetz et al. | ...................... | 257/79 |
| 2003/0122147 A1* | 7/2003 | Sheu | .............................. | 257/103 |
| 2005/0133809 A1* | 6/2005 | Song et al. | ...................... | 257/99 |
| 2005/0212002 A1 | 9/2005 | Sanga et al. | | |
| 2005/0236636 A1* | 10/2005 | Hon et al. | ...................... | 257/99 |

FOREIGN PATENT DOCUMENTS

| | | |
|---|---|---|
| JP | 2005-123501 | 5/2005 |
| JP | 2005-317931 | 11/2005 |
| JP | 2006-261358 | 9/2006 |
| KR | 10-2006-0007945 A | 1/2006 |
| KR | 10-0616592 | 8/2006 |
| KR | 10-2006-0109559 A | 10/2006 |

OTHER PUBLICATIONS

Korean Notice of Allowance issued in Patent Application No. 10-2006-0105772 dated on Aug. 7, 2008.
Japanese Office Action, with English translation, issued in Japanese Patent Application No. 2007-255480, dated Jul. 20, 2010.

* cited by examiner

*Primary Examiner* — Ha Tran T Nguyen
*Assistant Examiner* — Vongsavanh Sengdara
(74) *Attorney, Agent, or Firm* — McDermott Will & Emery LLP

(57) ABSTRACT

Provided is a nitride semiconductor light emitting diode (LED) including a substrate; an n-type nitride semiconductor layer formed on the substrate; an active layer formed on a portion of the n-type nitride semiconductor layer; a p-type nitride semiconductor layer formed on the active layer; a p-type contact layer formed on the p-type nitride semiconductor layer and doped with more than $1 \times 10^{20}/cm^3$ of p-type impurities; a transparent oxide electrode formed on the p-type contact layer; a p-electrode formed on the transparent oxide electrode; and an n-electrode formed on the n-type nitride semiconductor layer where the active layer is not formed.

4 Claims, 1 Drawing Sheet

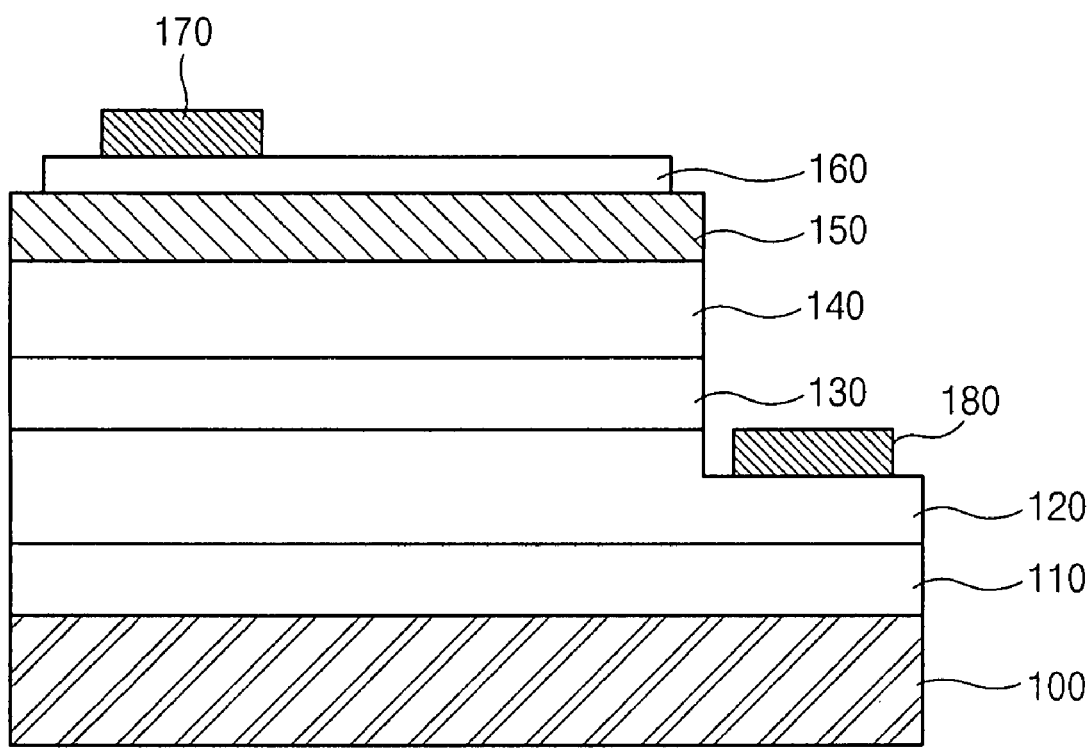

NITRIDE SEMICONDUCTOR LIGHT EMITTING DIODE

CROSS-REFERENCE TO RELATED APPLICATIONS

This application claims the benefit of Korean Patent Application No. 10-2006-0105772 filed with the Korean Intellectual Property Office on Oct. 30, 2006, the disclosure of which is incorporated herein by reference.

BACKGROUND OF THE INVENTION

1. Field of the Invention

The present invention relates to a nitride semiconductor light emitting diode (LED), in which a large quantity of impurity bands is formed in a p-type contact layer such that the p-type contact layer is ohmic-contacted with an n-type transparent oxide electrode such as Indium Tin Oxide (ITO) of which the transmittance is excellent, thereby reducing contact resistance and enhancing a current spreading effect. Accordingly, it is possible to reduce an operation voltage and to increase light emission efficiency.

2. Description of the Related Art

Devices using Group III-V nitride-based compound semiconductor are widely used in various fields. For example, they are used in electronic devices such as light emitting devices (such as LEDs and laser diodes (LDs)), light receiving devices (such as solar batteries, optical sensors and the like), transistors, and power devices. LDs and LEDs using such a material are essential for developing various light sources, such as natural-color electronic display boards, traffic signals, image scanner light sources and the like, and high-density optical recording mediums.

These nitride semiconductor LEDs have such a structure that a buffer layer, an n-type nitride semiconductor layer composed of a Si-doped GaN layer, an active layer with a single quantum-well or double-quantum well structure composed of InGaN/GaN, a clad layer composed of Mg-doped p-AlGaN, and a p-type nitride semiconductor layer composed of Mg-doped g-GaN layer are sequentially laminated on a sapphire substrate.

General nitride semiconductor LEDs have already used commonly, and LDs start to be used commonly. However, in order to use the LEDs as lighting sources or outdoor displays, the power of the LEDs needs to be improved. In the LDs, a threshold value should be reduced to lengthen their lifespan. Further, the LDs need to be further improved, in order to commonly use the LDs as stable light sources such as optical pickups, DVD and the like.

In the LEDs, their caloric value is reduced by reducing their operation voltage. Then, their reliability and lifespan can be enhanced. To increase a p-cladding effect, a p-AlGaN layer is grown to increase light extraction efficiency. Because of this, a piezo electric field strongly acts, so that blue shift may increase and the operation voltage may be increased. Accordingly, a p-type contract layer composed of p+GaN is grown on the p-type nitride semiconductor layer such that an ohmic characteristic is enhanced. Then, the operation voltage is reduced.

Conventionally, transparent oxide electrodes such as ITO and the like are used for forming ohmic contact. However, since the ITO is an n-type material, it forms a Schottky junction with the p-type contact layer such that a current does not uniformly flow. Further, the contact resistance and operation voltage increase. To reduce the contact resistance, different kinds of transparent electrodes such as ClO, ZnO, and MgZnO are used, thereby reducing the operation voltage. In such a method, however, the transmittance of the transparent electrodes is reduced more that that of a transparent electrode formed of one ITO layer. Further, since thin transparent electrodes for various kinds of contacts are formed, process time is lengthened, and management is not easy.

SUMMARY OF THE INVENTION

An advantage of the present invention is that it provides a nitride semiconductor light emitting diode (LED), in which a large quantity of impurity bands is formed in a p-type contact layer such that the p-type contact layer is ohmic-contacted with an n-type transparent oxide electrode such as Indium Tin Oxide (ITO) of which the transmittance is excellent, thereby reducing contact resistance and enhancing a current spreading effect. Accordingly, it is possible to reduce an operation voltage and to increase light emission efficiency.

Additional aspects and advantages of the present general inventive concept will be set forth in part in the description which follows and, in part, will be obvious from the description, or may be learned by practice of the general inventive concept.

According to an aspect of the invention, a nitride semiconductor light emitting diode (LED) comprises a substrate; an n-type nitride semiconductor layer formed on the substrate; an active layer formed on a portion of the n-type nitride semiconductor layer; a p-type nitride semiconductor layer formed on the active layer; a p-type contact layer formed on the p-type nitride semiconductor layer and doped with more than $1 \times 10^{20}/cm^3$ of p-type impurities; a transparent oxide electrode formed on the p-type contact layer; a p-electrode formed on the transparent oxide electrode; and an n-electrode formed on the n-type nitride semiconductor layer where the active layer is not formed.

Preferably, the transparent oxide electrode is formed of any one selected from the group consisting of ITO, ZnO, AZO, CuInO$_2$, $Zn_{1-x}Al_xO$, $Zn_{1-x}Mg_xO$, $SnO_2$, $RuO_2$, PdO, $Bi_2Ru_2O_7$, and $Bi_2Ir_2O_7$, which have an n-type characteristic.

Preferably, the transparent oxide electrode is composed of at least one or more layers.

Preferably, the transparent oxide electrode is doped with n-type or p-type conductive impurities.

According to another aspect of the invention, a nitride semiconductor light emitting diode (LED) comprises a substrate; an n-type nitride semiconductor layer formed on the substrate; an active layer formed on a portion of the n-type nitride semiconductor layer; a p-type nitride semiconductor layer formed on the active layer; a p-type contact layer formed on the p-type nitride semiconductor layer and doped with p-type impurities and n-type impurities having a lower doping concentration than that of the p-type impurities; a transparent oxide electrode formed on the p-type contact layer; a p-electrode formed on the transparent oxide electrode; and an n-electrode formed on the n-type nitride semiconductor layer where the active layer is not formed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a nitride semiconductor LED according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a nitride semiconductor LED according to an embodiment of the present invention will be described in detail with reference to the accompanying drawing.

FIG. 1 is a cross-sectional view of a nitride semiconductor LED according to an embodiment of the invention.

As shown in FIG. 1, the nitride semiconductor LED includes a buffer layer 110, an n-type nitride semiconductor layer 120, an active layer 130, and a p-type nitride semiconductor layer 140, which are sequentially laminated on an optically-transparent substrate 100.

Portions of the p-type nitride semiconductor layer 140 and the active layer 130 are removed by a mesa-etching process such that a portion of the upper surface of the n-type nitride semiconductor layer 120 is exposed.

The substrate 100 is suitable for growing nitride semiconductor single crystal. Preferably, the substrate 100 is formed of a transparent material including sapphire. In addition to sapphire, the substrate 100 may be formed of SiC, Si, AlN, ZnO or GaN.

The n-type and p-type nitride semiconductor layers 120 and 140 and the active layer 130 can be formed of a semiconductor material having a compositional formula of $Al_yIn_xGa_{(1-x-y)}N$ (here, $0 \leq x \leq 1$, $0 \leq y \leq 1$, and $0 \leq x+y \leq 1$) and may be formed by a known nitride deposition process such as Metal-Organic Chemical Vapor Deposition (MOCVD) or Molecular Beam Epitaxy. More specifically, the n-type nitride semiconductor layer 120 can be formed of a GaN or GaN/AlGaN layer doped with n-type impurities. For the n-type impurities, Si and the like may be used. Further, the p-type nitride semiconductor layer 140 can be formed of a GaN or GaN/AlGaN layer doped with p-type impurities. For the p-type impurities, Mg and the like may be used. The active layer 130 may be formed of an $In_xAl_yGa_{1-x-y}N/In_aAl_bGa_{1-a-b}N$ layer ($x \leq 1$, $y \leq 1$, $a \leq 1$, and $b \leq 1$) with a multi-quantum well structure. For example, an InGaN/GaN layer can be used.

On the p-type nitride semiconductor layer 140, a p-type contact layer 150 for ohmic contact and an n-type transparent oxide electrode 160 for enhancing a current spreading effect are sequentially formed.

Preferably, the transparent oxide electrode 160 is formed of ITO. In addition to the ITO, the transparent oxide electrode 160 may be formed of ZnO, AZO, $CuInO_2$, $Zn_{1-x}Al_xO$, $Zn_{1-x}Mg_xO$, $SnO_2$, $RuO_2$, PdO, $Bi_2Ru_2O_7$, or $Bi_2Ir_2O_7$. Since the transparent oxide electrode 160 has excellent transmittance and low contact resistance, it can reduce an operation voltage and increase light emission efficiency.

The transparent oxide electrode 160 may be composed of more than two layers depending on the purpose. In this case, since light is diffused at the interface between the layers, the transmittance can be reduced. Therefore, it is preferable that the transparent oxide electrode 160 is formed of a single layer.

In particular, the transparent oxide electrode 160 according to the invention may be doped with n-type or p-type conductive impurities, thereby enhancing a contact characteristic and conductivity.

On the transparent oxide electrode 160, a p-electrode 170 is formed. On the n-type nitride semiconductor layer 120 exposed by the mesa-etching process, an n-electrode 180 is formed.

To enhance ohmic contact, more than $1 \times 10^{20}/cm^3$ of p-type impurities such as Mg are doped on the p-type contact layer 150. Alternately, p-type impurities such as Mg are doped on the p-type contact layer 150, and n-type impurities are doped at a lower doping concentration than that of the p-type impurities. As for the n-type impurities doped in the p-type contact layer 150, Si, C, or O can be used.

When the p-type contact layer 150 is doped with the p-type impurities having a doping concentration lower than $1 \times 10^{19}/cm^3$, the p-type contact layer 150 has only a p-type characteristic such that the impurity band decreases. Accordingly, since an ohmic contact characteristic desired in the invention cannot be obtained, it is preferable that more than $1 \times 10^{19}/cm^2$ of p-type impurities are doped.

As described above, when more than a predetermined concentration of p-type impurities are doped on the p-type contact layer 150 or n-type impurities as well as p-type impurities are doped, the p-type contact layer 150 has a p-type characteristic, or a large quantity of impurity band is formed. Simultaneously, the p-type characteristic is weakened. Therefore, the ohmic contact characteristic with the n-type transparent oxide electrode 160 such as ITO can be considerably enhanced.

Basically, there is no material, of which the work function is as high as to form ohmic in P-GaN, in p-ohmic contact. However, it is known that when a discrete band is formed, ohmic is formed by electron transmission into an impurity level. Therefore, when a p-GaN material for forming the p-type contact layer 150 is grown, n-type impurities such as Si or the like are doped together. Alternately, as a larger quantity of impurity bands is formed in the side of a donor band by controlling the generation of impurities relating to N-vacancy or Mg—H complex, the p-type contact layer 150 can be ohmic-contacted with n-type materials such as ITO, ZnO and the like.

According to the nitride semiconductor LED of the invention, a large quantity of impurity bands is formed in the p-type contact layer such that the p-type contact layer is ohmic-contacted with the n-type transparent oxide electrode, such as ITO or the like, of which the transmittance is excellent. Then, contact resistance is reduced, thereby enhancing a current spreading effect. Therefore, the operation voltage of devices can be reduced, light emission efficiency can be enhanced, and surge and ESD impact can be reduced.

Accordingly, it is possible to strengthen durability of devices and to enhance reliability thereof.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride semiconductor light emitting diode (LED) comprising:
    a substrate;
    an n-type nitride semiconductor layer formed on the substrate;
    an active layer formed on a portion of the n-type nitride semiconductor layer;
    a p-type nitride semiconductor layer formed on the active layer;

a p-type contact layer formed on the p-type nitride semiconductor layer and doped with p-type impurities as well as n-type impurities, a transparent oxide electrode formed on the p-type contact layer;

a p-electrode formed on the transparent oxide electrode; and an n-electrode formed on the n-type nitride semiconductor layer in a portion of a region in which the active layer is not formed, wherein the p-type contact layer has a contacting area being in direct contact with the transparent oxide electrode, wherein a doping concentration of the n-type impurities is lower than that of the p-type impurities in the contacting area of the p-type contact layer attached to the transparent oxide electrode.

2. The nitride semiconductor LED according to claim 1, wherein the transparent oxide electrode is formed of any one selected from the group consisting of ITO, ZnO, AZO, $CuInO_2$, $Zn_{1-x}Al_xO$, $Zn_{1-x}Mg_xO$, $SnO_2$, $RuO_2$, PdO, $Bi_2Ru_2O_7$, and $Bi_2Ir_2O_7$, which have an n-type characteristic;

3. The nitride semiconductor LED according to claim 1, wherein the transparent oxide electrode is composed of at least one or more layers.

4. The nitride semiconductor LED according to claim 1, wherein the transparent oxide electrode is doped with n-type or p-type conductive impurities.

* * * * *